US008243519B2

(12) United States Patent
Park et al.

(10) Patent No.: US 8,243,519 B2
(45) Date of Patent: Aug. 14, 2012

(54) WRITING METHOD OF A NONVOLATILE MEMORY DEVICE

(75) Inventors: Sangkug Park, Bucheon-si (KR); Dae han Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 281 days.

(21) Appl. No.: 12/719,124

(22) Filed: Mar. 8, 2010

(65) Prior Publication Data

US 2010/0254193 A1 Oct. 7, 2010

(30) Foreign Application Priority Data

Apr. 2, 2009 (KR) .................. 10-2009-0028590

(51) Int. Cl.
*G11C 11/34* (2006.01)
(52) U.S. Cl. .......... 365/185.18; 365/185.19; 365/185.03
(58) Field of Classification Search ............. 365/185.18, 365/185.19, 185.03, 185.28, 185.11
See application file for complete search history.

(56) References Cited

U.S. PATENT DOCUMENTS

| 7,349,263 | B2 | 3/2008 | Kim et al. |
| 7,388,782 | B2 * | 6/2008 | Tokiwa ............... 365/185.09 |
| 7,599,219 | B2 | 10/2009 | Kim et al. |
| 7,602,648 | B2 | 10/2009 | Lee |
| 7,688,632 | B2 * | 3/2010 | Nagashima et al. ..... 365/185.19 |

FOREIGN PATENT DOCUMENTS

| JP | 2000113686 | | 4/2000 |
| JP | 2007012251 | | 1/2007 |
| KR | 1020070000525 | A | 1/2007 |
| KR | 100824203 | B1 | 4/2008 |

* cited by examiner

*Primary Examiner* — David Lam
(74) *Attorney, Agent, or Firm* — Volentine & Whitt, PLLC

(57) ABSTRACT

A method of performing a writing operation of a nonvolatile memory device is provided. The method includes performing a first band program using trim information from a first band register of multiple band registers, which include at least a default band register; and performing a second band program using trim information from a second band register or trim information from the default band register after performing the first band program. The second band register is selected while the first band program is being performed.

11 Claims, 14 Drawing Sheets

Fig. 13

| BR | Vstart | Vstep | tPGM | PGM Cell | Vfy | Muliti vfy | Vfy Level | Vfy 1 Level | ... | Vfy N Level | Band Max | Max Loop |
|---|---|---|---|---|---|---|---|---|---|---|---|---|
| BR0 | 2V | 2V | 500ns | 16 Cell | Disable | Disable | - | - | | - | 2 | 64 |
| BR1 | 6V | - | 500ns | 16 Cell | Disable | Enable | - | 4V | | 5V | - | 64 |
| BR2 | 6.5V | 0.27V | 300ns | 8 Cell | Disable | Disable | - | - | | - | 5 | 64 |
| BR3 | 6.4V | 0.25V | 300ns | 8 Cell | Disable | Disable | - | - | | - | 5 | 64 |
| BR4 | 6.3V | 0.22V | 300ns | 8 Cell | Disable | Disable | - | - | | - | 5 | 64 |
| BR5 | 6.2V | 0.2V | 300ns | 8 Cell | Disable | Disable | - | - | | - | 5 | 64 |
| BR6 | 7V | 0V | 400ns | 16 Cell | Enable | Disable | 6.7V | - | | - | 10 | 64 |
| BR7 | 7.2V | 0V | 400ns | 16 Cell | Enable | Disable | 6.7V | - | | - | 10 | 64 |

WRITING METHOD OF A NONVOLATILE MEMORY DEVICE

CROSS-REFERENCE TO RELATED APPLICATION

A claim of priority is made to Korean Patent Application No. 10-2009-0028590, filed Apr. 2, 2009, in the Korean Intellectual Property Office, the subject matter of which is hereby incorporated by reference.

BACKGROUND

Exemplary embodiments relate to a method of writing for a nonvolatile memory device, and more particularly, to a method of writing using multiple band programs.

Generally, flash memory devices are nonvolatile semiconductor memory devices, which are electrically programmable and erasable. As demand for high speed, high density nonvolatile memory devices increases for mobile electronic devices requiring high density storage or coded memory, flash memory devices have become more popular.

Flash memory devices may be NAND type or NOR type. Generally, a memory cell array of NOR type flash memory has memory cells is connected to a bit line in parallel. On the other hand, a memory cell array of NAND type flash memory has memory cells connected to a bit line in series.

The program or read operation speeds of the NOR type flash memory are faster than those of NAND type flash memory due to the cell array structure, which makes the NOR type flash memory preferable when higher speed characteristics are needed. However, the NOR type flash memory is less integrated than the NAND type flash memory due to the cell array structure.

Multi-level flash memory devices are used to meet the need for higher density. A multi-level cell is able to store two or more bits, thus providing a solution to address limitations in flash memory devices. However, writing conditions are not sufficiently optimized to provide sufficient margins of threshold voltages of the memory cells in the multi-level flash memory devices.

SUMMARY

According to an exemplary embodiment, a method of performing a write operation of a nonvolatile memory device includes performing a first band program using trim information from a first band register of multiple band registers, the multiple band registers including at least a default band register; and performing a second band program using trim information from a second band register or trim information from the default band register after performing the first band program. The second band register is selected while the first band program is being performed.

In an exemplary embodiment, the method of performing a write operation may further include determining whether to select the second band register for the second band program while the first band program is being performed. The second band register may be an optimized band register storing an optimized writing condition for the second band program. The default band register is selected for the second band program when it is determined not to select the second band register for the second band program.

In an exemplary embodiment, when the optimized band register is selected, a verifying operation may be performed and the optimized band register may be selected according to the result of the verifying operation.

In an exemplary embodiment, performing each of the first and second band programs may include setting up high voltages using the trim information; determining whether there is a memory cell to be programmed; providing the high voltage to a word line, a bit line and a bulk when there is a memory cell to be programmed; determining whether a band loop is at a maximum; and increasing a loop count when the band loop number is not at the maximum. The second band register for the second band program may be selected through multiple verifying operations during the performing of the first band program.

Also, the multiple verifying operations may include verifying an upper limitation to detect a program upper limitation of the memory cell.

According to another exemplary embodiment, a method of performing a write operation of a nonvolatile memory device includes performing multiple band programs sequentially, each of band program using one of multiple band registers, each of which stores trim information for a writing condition. Performing each band program includes determining whether there is a memory cell to be programmed; programming the memory cell using trim information of the selected band register; determining whether a band loop count is at a maximum; increasing the band loop count when the band loop count is not at the maximum; and selecting one of the band registers storing trim information for the next band program.

When the band loop count is at the maximum, it may be determined whether restart times are at a maximum. When the restart times are not at the maximum, the band programs are performed again from the beginning. When there is no memory cell to be programmed, the write operation is finished.

BRIEF DESCRIPTION OF THE DRAWINGS

Various aspects of the drawings may have been exaggerated for clarity. Exemplary embodiments of the inventive concept will be described with reference to the attached drawings, in which:

FIG. 13 shows trim information stored in the band register, according to an exemplary embodiment.

DETAILED DESCRIPTION OF EMBODIMENTS

Figure 1:
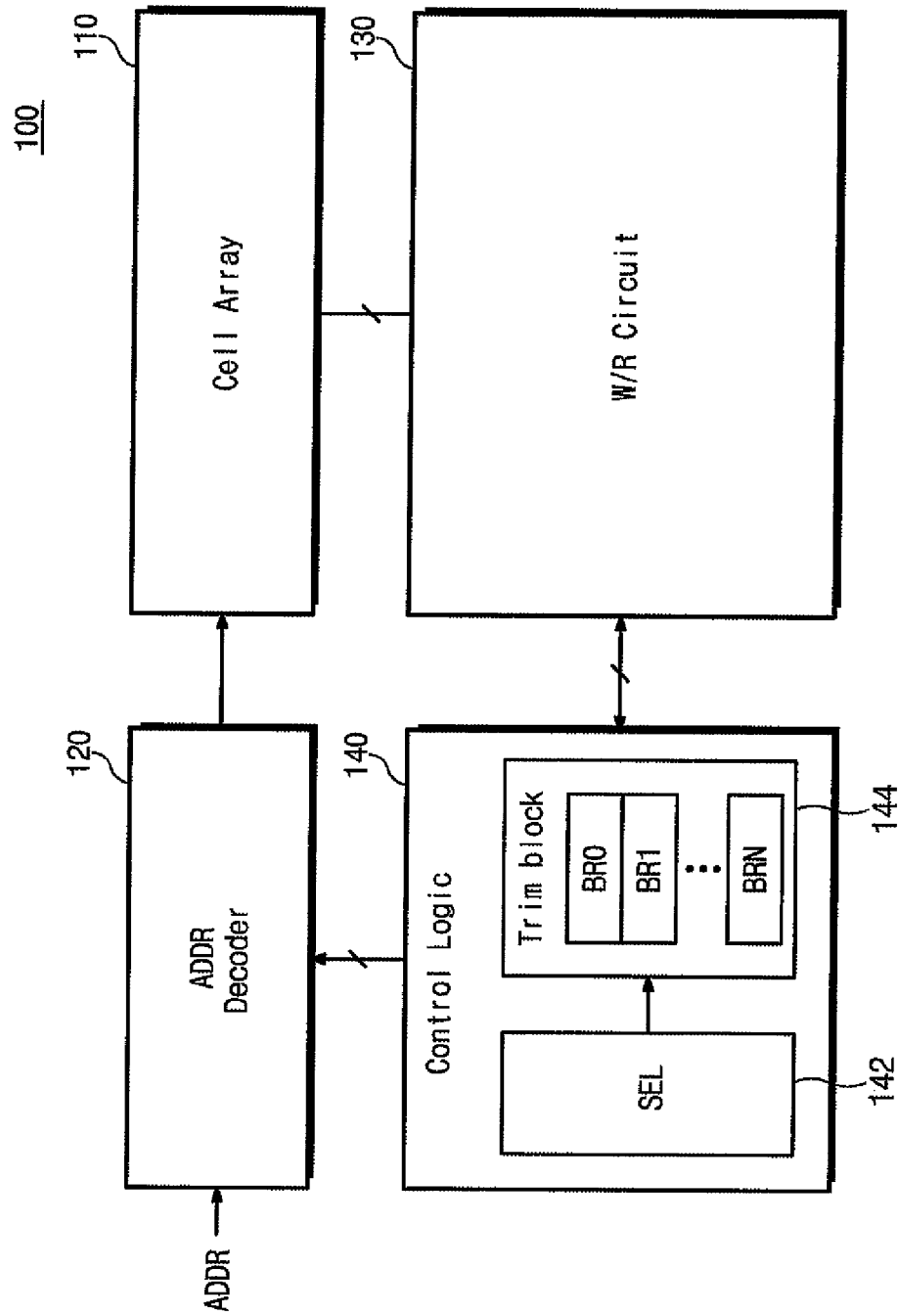
FIG. 1 is a block diagram of a nonvolatile memory device, according to an exemplary embodiment.

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments. Throughout the drawings and written description, like reference numerals will be used to refer to like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

A writing method of a nonvolatile memory device according to an illustrative embodiment includes sequentially operating multiple band program operations, and automatically selecting an optimized writing condition for a next band program operation when each band program operation occurs. Thus the writing method of this example can make the write operation to be performed with the optimized writing condition.

FIG. 1 is a block diagram showing a nonvolatile memory device, according to an illustrative embodiment. Referring to FIG. 1, the nonvolatile memory device 100 includes a memory cell array 110, an address decoder 120, a write/read circuit 130, and control logic 140. The control logic 140 according to an embodiment is configured to select a band register that stores an optimized writing condition during a write operation, and to program the write operation using trim information stored in the selected band register.

The memory cell array 110 includes multiple memory cells formed at intersections between multiple word lines and multiple bit lines. The memory cells are turned on or off according to the voltage provided to a selected word line. The on/off states of the memory cells determine the amount of current flow of the bit lines. Data programmed into the memory cells are sensed by the current flow on the corresponding bit line and output to an external device.

The address decoder 120 selects a block of the memory cell array 110 and selects a word line in the selected block, in response to an input address ADDR. The address decoder 120 may include a high voltage generator (not shown) to generate a word line voltage that is provided to the selected word line.

The write/read (W/R) circuit 130 may include a write circuit (not shown) to write data to be programmed to the memory cell array 110, and a read circuit (not shown) to read data stored in the memory cell array 110.

The control logic 140 controls overall operations of the nonvolatile memory device 100. The control logic 140 controls the address decoder 120 and the write/read circuit 130 so that multiple band programs are performed sequentially. Each band program will be described with reference to FIG. 3 below.

The control logic 140 is configured to select a band register that stores optimized trim information while each band program occurs. For example, the trim information may include information that is needed for a write operation, such as starting voltage level, step voltage level, loop repetition number, program time, and the like.

The control logic 140 includes a select circuit (SEL) 142 and a trim block 144. The trim block 144 includes band registers BR0-BRn, each of which includes trim information to control a write operation.

The select circuit 142 selects a band register that stores an optimized writing condition for the next band program, while the current band program is performed during the write operation. The band register is selected from among the multiple band registers BR0-BRN.

A conventional nonvolatile memory device performs a write operation with fixed trim information. In comparison, the nonvolatile memory device 100, according to various embodiments, is able to select an optimized writing condition during a write operation, and performs the write operation in accordance with the selected optimized writing condition.

By performing the write operation in accordance with the selected optimized writing condition, the nonvolatile memory device may increase the threshold voltage margin of the memory cell, while reducing the writing time. Thus, the nonvolatile memory device 100 may be operated with an optimized writing condition, which improves the performance of a write operation.

Figure 2:
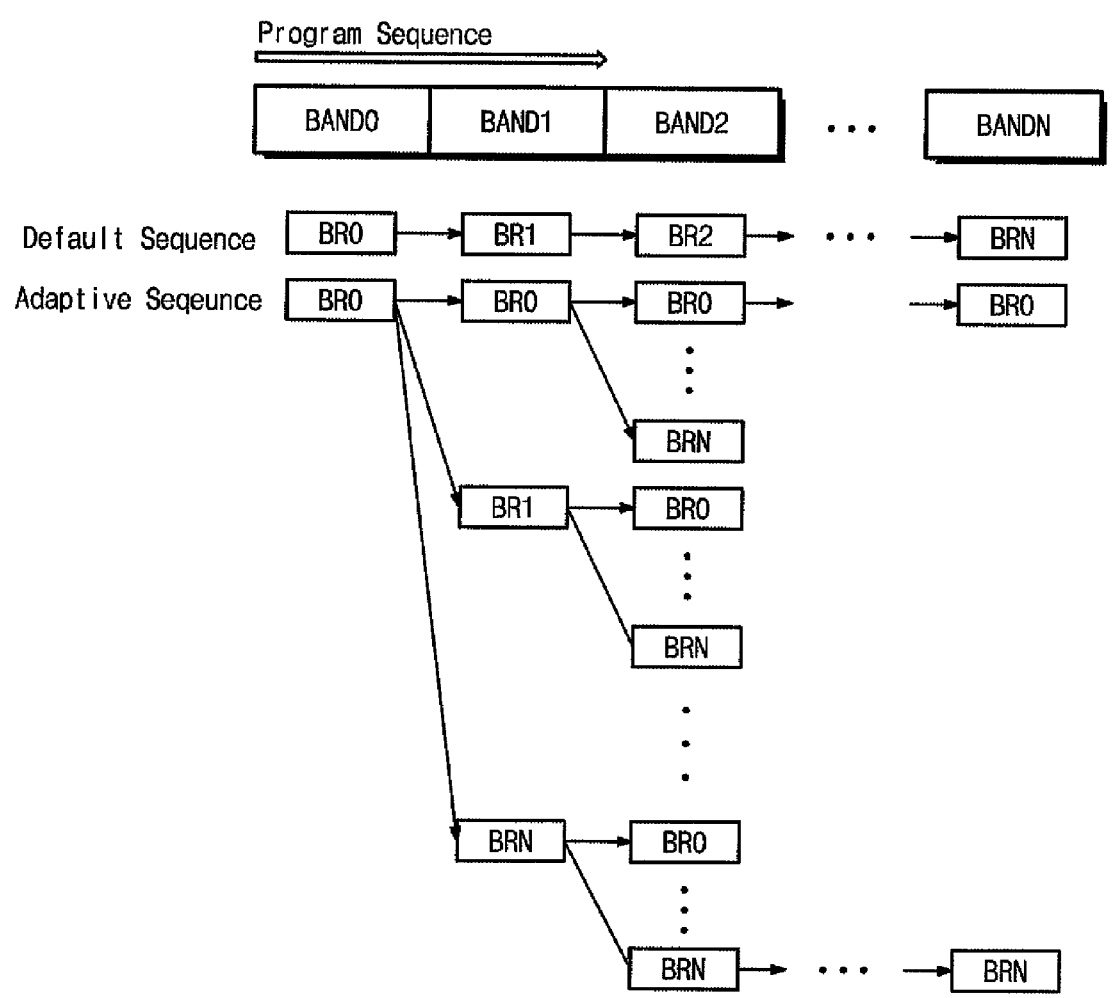
FIG. 2 shows a program sequence of a write operation of the nonvolatile memory device, according to an exemplary embodiment.

FIG. 2 shows a band program sequence of a write operation of the nonvolatile memory device, according to an illustrative embodiment.

Referring to FIG. 2, the write operation includes multiple band programs BAND0~BANDN. Each of the band programs BAND0~BANDN performs a program operation using trim information stored in the band registers BR0~BRN selected by the control logic 140.

In the example of a write operation shown in FIG. 2, there are two types of band programs, one of which is performed with a default sequence and the other of which is performed with an adaptive sequence. According to the selection made by the select circuit 142 in the control logic 140, the band program may be performed in many different ways. That is, each band program may be performed using trim information of a default band register in each band program, or using trim information of a selected band register in each band program.

The write operation according to an illustrative embodiment may be configured to select a band register that stores an optimized writing condition for each band program. However, the write operation is not limited to this example. The write operation may be configured to decide whether or not to select the band register-that stores an optimized writing condition in each band program.

Also, a verifying operation may be used to select the optimized writing condition while a band program occurs. Distribution of threshold voltages of the memory cells to be programmed is detected using the verifying operation. An optimized writing condition can be selected using this information in each band program. However, the method of selecting the optimized writing condition may not include the verifying operation, without departing from the scope of the disclosure.

Figure 3:
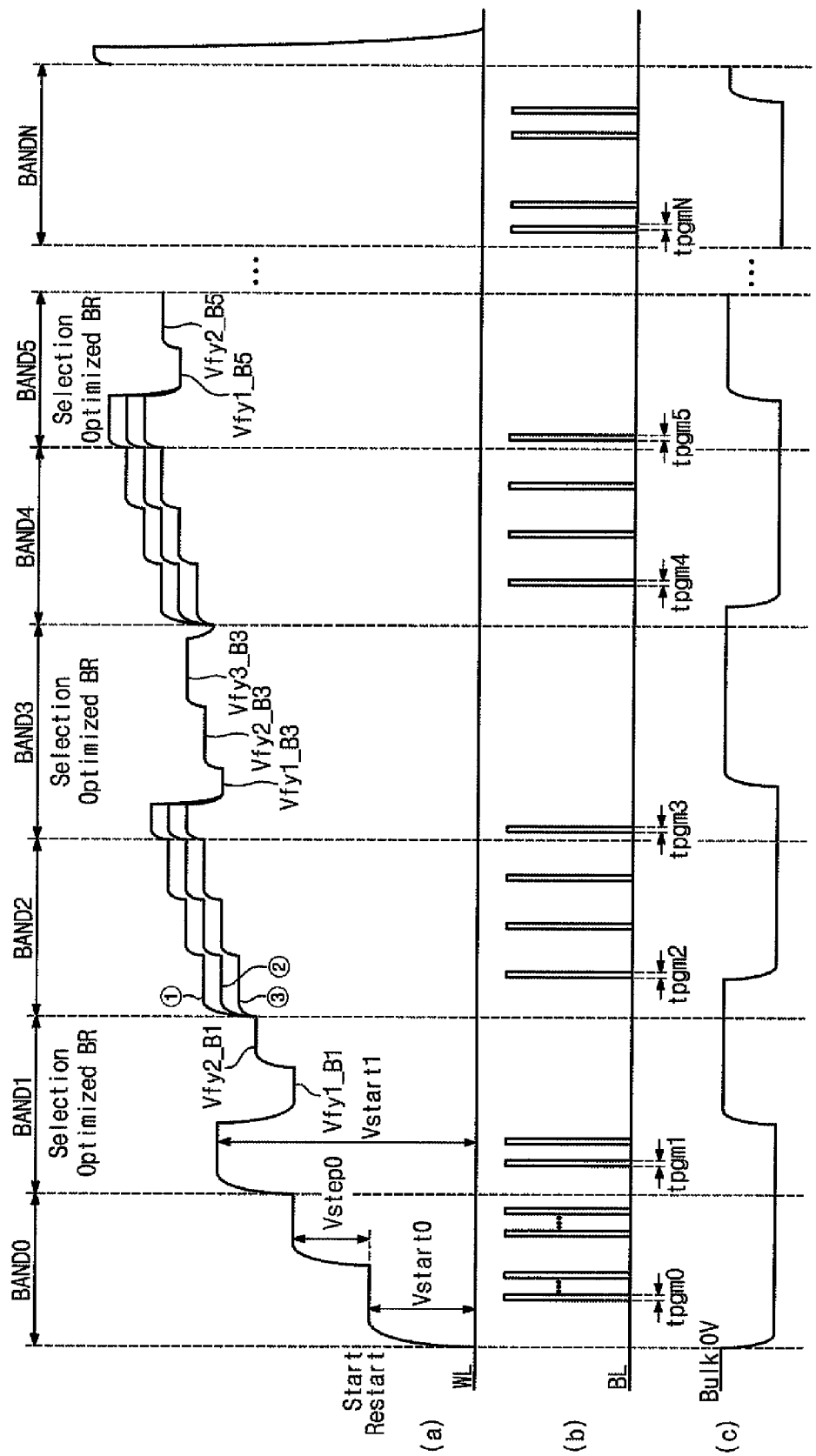
FIG. 3 is a diagram showing representative voltages applied to each band of the write operation of the nonvolatile memory device illustrated in FIG. 2.

FIG. 3 shows example voltages used in each band program of a write operation of the nonvolatile memory device illustrated in FIG. 2, according to an illustrative embodiment. For purposes of explanation, it is assumed that the memory cell array 110 of the nonvolatile memory device 100 is a NOR cell structure, although other types of cell structures may be incorporated. Referring to FIG. 3, the voltages are respectively provided to representative word line WL, bit line BL and bulk for the write operation.

The write operation includes multiple band programs BAND0~BANDN. In the first band program BAND0, the BAND0 program is performed using trim information stored in a first band register BR0. The trim information of the first band register BR0 may include starting voltage level Vstart0, an indication of whether to perform a verifying operation, step level Vstep0, an indication of whether to perform multiple verifying (multi-verify) operations, the number of memory cells to be programmed at a time, programming time tpg0, and the maximum number of band loops, for example.

The bit line voltage is provided to a bit line of the memory cell to be programmed during the programming time tpg0. A negative voltage is provided to the bulk while the first band program BAND0 is performed. In the depicted example, verifying and multi-verifying operations are not performed in the first band program BAND0.

As shown in FIG. 3, the maximum number of band loops is 2 in the first band program BAND0. Thus, the first band program BAND0 is finished after high voltage Vstart0+Vstep0 is supplied to the word line WL during a certain time.

Next, the second band program BAND1 begins. The second band program BAND1 includes a program period and a verifying period. In the depicted example, the second band program BAND1 is performed using the trim information of a default second band register BR1. The trim information of the default second band register BR1 may include starting voltage level Vstart1, an indication of whether to perform a verifying operation, step level Vstep1, an indication of whether to perform multiple verifying operations, the number of memory cells programmed at a time, programming time tpgm1 and the maximum number of band loops, for example.

The bit line voltage is provided to the bit line BL of the memory cell to be programmed during the programming time tpgm1. Also, the negative voltage is provided to the bulk during the program period.

In the second band program BAND1, multiple verifying operations are performed to select an optimized band register that will be used for the next band program, third band program BAND2. The verifying levels for the second band program BAND1 include a first verifying level Vfy1_B1 and a second verifying level Vfy2_B2. By the verifying operations, distribution of the threshold voltage of the programmed cell is identified, and based on the results, the optimized band register that will be used for the next band program BAND2 is selected. For example, in the third band program BAND2, one of three different word line voltages according to the trim information of the selected optimized band register may be provided to the word line WL. At this time, the selected band register may be a band register used for the band program being used or a different band register. Voltage 0 is supplied to the bulk while the multiple verifying operations occur.

When the second band program BAND1 ends, the third band program BAND2 begins using the trim information of the selected band register, which stores optimized trim information for the distribution characteristics of the identified threshold voltage that is acquired as a result of the verifying operations of the second band program BAND1. That is, one of three word line voltages is selected by the selected band register during the previous band program. The third band program BAND2 includes only a program period. When the third band program BAND2 is finished, the fourth band program BAND3 begins.

The fourth band program BAND3 is performed using a default fourth band register BR3. The fourth band program BAND3 includes a program period and a verifying period. The bit line voltage is provided to the bit line of the memory cell during program time tpgm3. The negative voltage is provided to the bulk during the program period. In the fourth band program BAND3, multiple verifying operations are performed to select an optimized band register for the next band program BAND4. The verifying levels used for the fourth band program BAND3 includes Vfy1_B3, Vfy2_B3 and Vfy3_B3.

Figure 4:
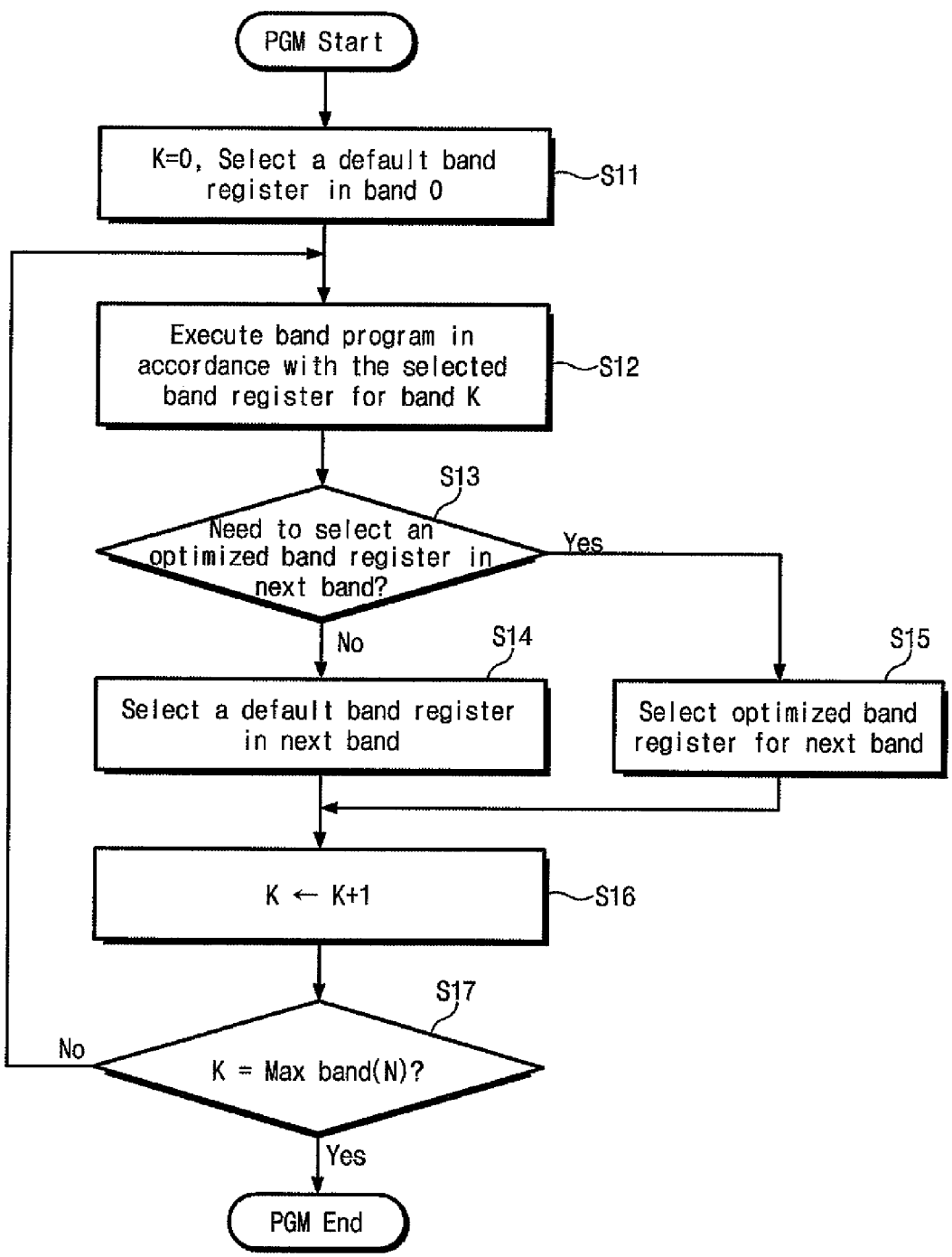
FIG. 4 is a flowchart showing a first writing method of the nonvolatile memory device, according to exemplary embodiments.

By the multiple verifying operations in the fourth band program BAND3, distribution of the threshold voltage of the programmed cell is identified, and based on the identified results, the optimized band register that will be used for the next band program BAND4 is selected. As shown in FIG. 4, one of three sets of trim information that can be used for the fifth band program BAND4 is selected as optimized trim information. While this verifying is being performed, voltage 0 is provided to the bulk. When the fourth band program BAND3 is finished, the fifth band program BAND4 will begin.

The fifth band program BAND4 includes only a program period. In the fifth band program BAND4, the programming is performed using the optimized trim information of the selected band register. When the fifth band program BAND4 is finished, a sixth band program BAND5 begins.

In the same manner described above, N+1th band program BANDN is performed. When there is no memory cell to be programmed in any previous band program BAND0~BANDN−1, the write operation will be finished. When there is a memory cell to be programmed even after the last band program BANDN has been performed, the multiple band programs will be performed again, beginning with the first band program BAND0. To prevent repeatedly re-starting the programming and falling into an infinite loop, the maximum number of re-starting programs may be limited to a predetermined number of times.

The write operation according to various embodiments performs multiple band programs sequentially. Each band program may be performed using trim information in a default band register or may be performed using optimized trim information stored in a selected band register by verifying operation(s) during a previous band program. As a result, the write operation may be performed under optimized writing conditions.

The optimized writing conditions explained above are limited to characteristics of the programmed memory cell. However, the writing conditions are not limited. They may also include other writing conditions that reduce the program time or a certain condition that affects improvement of operation of the nonvolatile memory device.

FIG. 4 is a flowchart showing a first writing method of the nonvolatile memory device, according to an illustrative embodiment. Hereinafter, the first writing method will be described with reference to FIG. 1 to FIG. 4.

The writing method begins in response to a write command input from an external device, such as a memory controller. In step S11, in which K initially equals 0, the first band register BR0 is selected as a default band register for the first band program BAND0. In step S12 the first band program BAND0 is executed using the trim information stored in the first band register BR0. It is then determined in step S13 whether to select a band register that stores optimized trim information for the next band program BAND($K_+1$). Determining whether to select an optimized band register for the next band program is based on the trim information of the selected band register for the band program being performed (BANDK). That is, the currently used trim information may include information regarding whether to select the optimized band register. For example, whether multiple verifying operations are enabled, as shown in FIG. 13, may be used to decide whether to select the optimized band register. Through the multiple verifying operations, for example, the threshold voltage of a programmed memory cell is detected, and the results of the multiple verifying operations are used for determining whether to select the optimized band register.

When there is no need to select the optimized band register in step S13, a band register for the next band program BAND (K+1) is selected as a default register BR(K+1) in step S14. On the other hand, when it is determined in step S13 that an optimized band register is to be selected, the optimized band register that will be used for the next band program BAND (K+1) is selected in step S15. In step S16, K is incremented by 1. K is then compared to N, which is the maximum number of band programs, in step S17. When K is less than N, the process returns to step S12 and the next band program is executed. When K equals N, the write operation ends.

Figure 5:
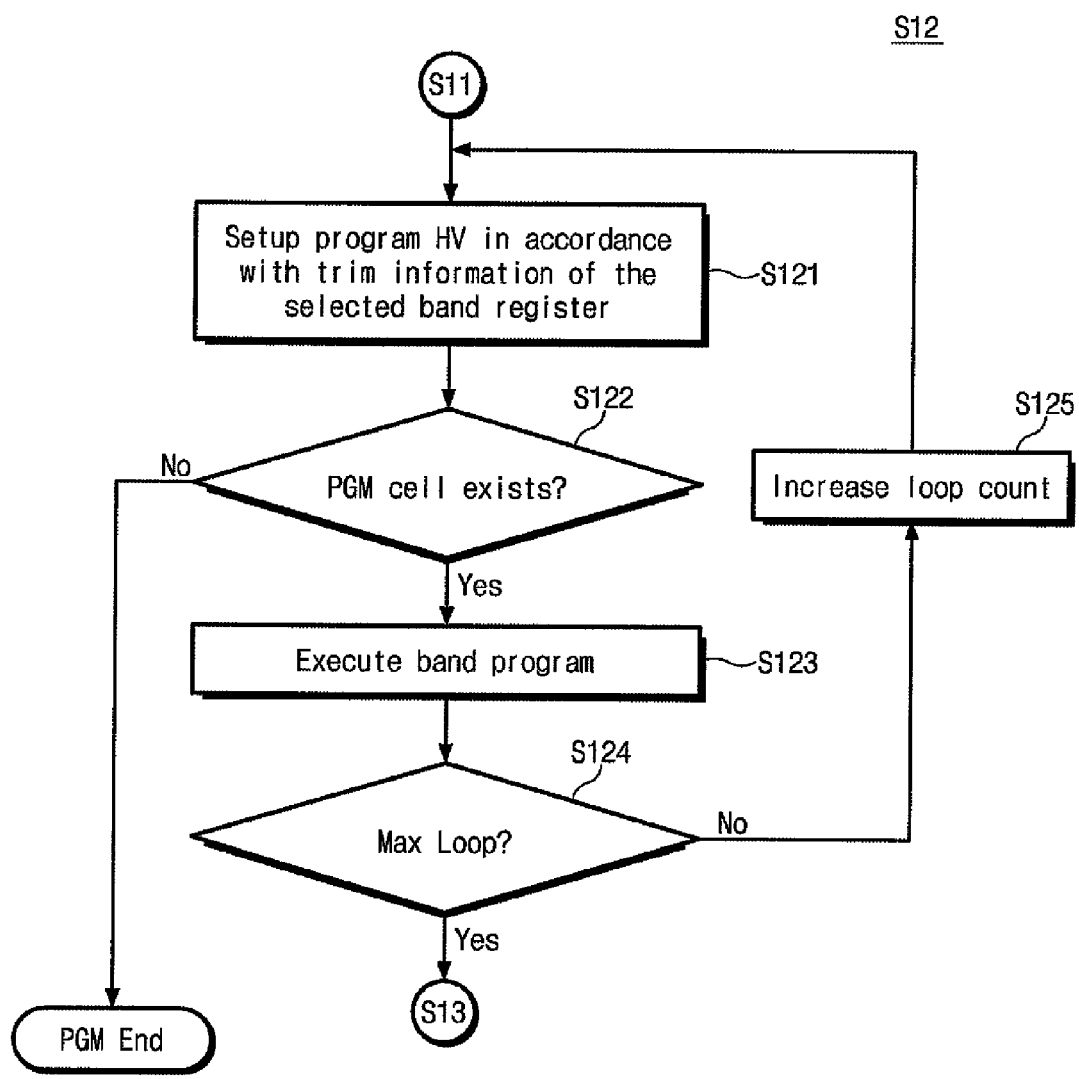
FIG. 5 is a flowchart of step S12 illustrated in FIG. 4, according to an exemplary embodiment.

FIG. 5 is a flowchart of the program operation of step S12 illustrated in FIG. 4, according to an illustrative embodiment. Referring to FIG. 5, the flowchart of program operation of step S12 is as follows.

In step S121, high program voltages are setup using the trim information of the selected band register for the previous band program operation or for the first band program operation. For example, as shown in FIG. 3, a high voltage generator generates voltages, using the trim information of the selected band register, which are supplied to the word line WL, the bit line BL and the bulk. In step S122, it is determined whether a memory cell to be programmed exists, which may be determined using a general verifying operation, for example. When there is no memory cell to be programmed, the program ends. On the other hand, when there is a memory cell to be programmed, as shown in FIG. 3, the band program is performed in step 123 by supplying the voltages generated by the voltage generator, using the trim information of the selected band register, to the word line WL, the bit line BL and the bulk.

Each band program may be performed using increment step pulse programming (ISPP), for example. In step S124, it is determined whether the maximum number of loops in the band program has been performed. When the maximum number of loops has not been performed, a loop count value is increased in step S125 and the band program returns to step S121. When the maximum number of loops has been performed, the band program proceeds to the step S13.

Figure 6:
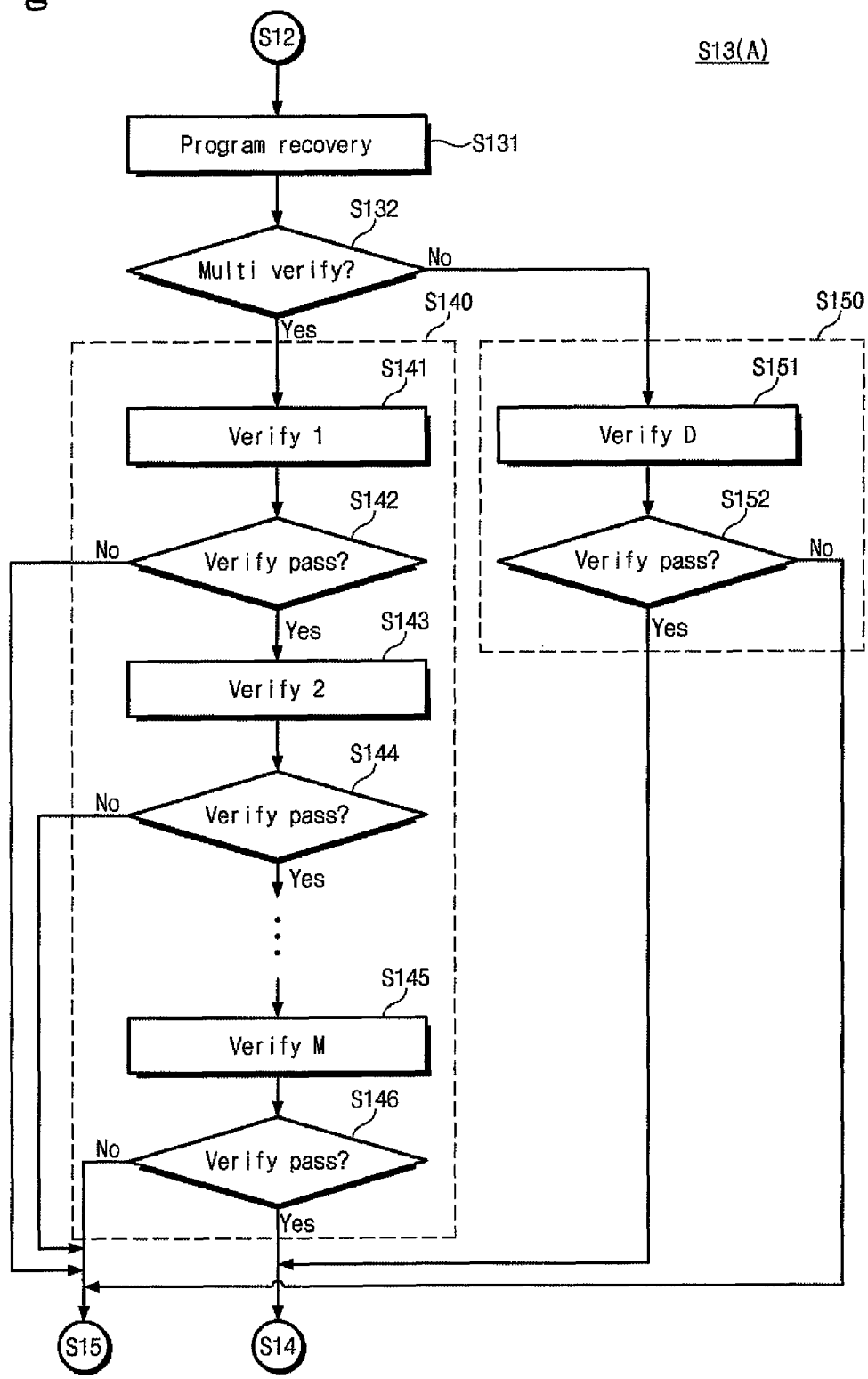
FIG. 6 is a flowchart showing a first verifying method of step S13 illustrated in FIG. 4, according to an exemplary embodiment.
Figure 7:
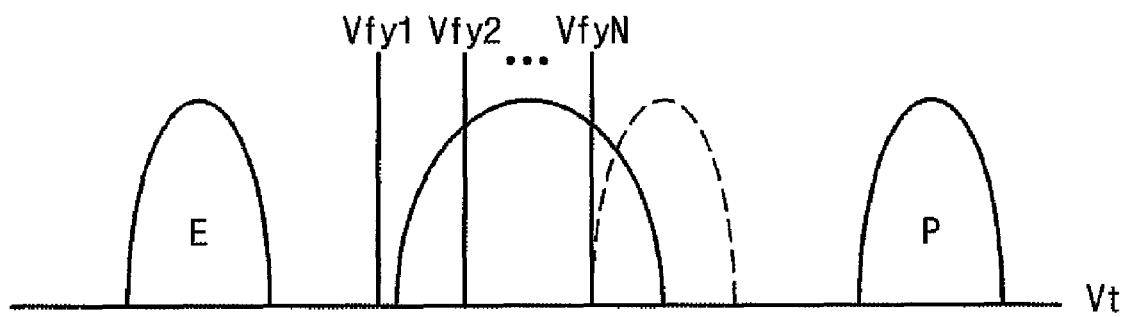
FIG. 7 shows a distribution of threshold voltage in the verification step illustrated in FIG. 6, according to an exemplary embodiment.

FIG. 6 is a flowchart showing a first determining method for step S13 illustrated in FIG. 4, according to an illustrative embodiment. FIG. 7 shows a threshold voltage distribution of multiple verifying operations. Referring to FIG. 6, a first determining method S13(A) in each band program may include multiple verifying operations, as follows.

In step S131, a program recovery occurs after the program period in each band program. Then, in step S132, it is determined whether to perform multiple verifying operations. The multiple verifying operations, as shown in FIG. 7, mean that at least two or more different verifying operations are performed successively. When the multiple verifying operations are to be performed, step S140 will be performed as a next operation. When the multiple verifying operations are not to be performed, step S150 will be performed.

Step S140 includes steps S141 through S146. Verifying operation Verify 1 is performed using first verifying voltage Vfy1 in step S141, and it is determined whether verifying operation Verify 1 passes in step S142. When verifying operation Verify 1 has passed, Verifying operation Verify 2 of the programmed cell is performed using second verifying voltage Vfy2 in step S143, and it is determined whether verifying operation Verify 2 passes in step S144. When verifying operation Verify 2 has passed, the process continues to execute subsequent verifying operations of the programmed cell using corresponding verifying voltages and to determine whether the verifying operations pass, in the same manner, until Verifying operation Verify M is performed using the Mth verifying voltage (where M is the total number of multiple verifying operations) in step S145. It is determined whether verifying operation Verify M passes in step S146. When verifying operation Verify M has passed, the program goes to step S14 of FIG. 4, and a default band register will be selected for the next band program, as discussed above. On the other hand, when any of the verifying operations Verify 1 through Verify M has not passed (has failed), the program goes to step S15 of FIG. 4, and an optimized band register will be selected for the next band program, as discussed above.

Step S150 includes steps S151 through S152, and is performed as described below. Verifying operation Verify D of the programmed cell is performed with verifying voltage in step S151, and it is determined whether the verifying operation Verify D passes in step S152. When Verify D has passed, the program goes to the step S14 of FIG. 4, so that a default band register will be selected for the next band program. When Verify D has not passed, the program goes to the step S15 of FIG. 4, so that an optimized band register will be selected for the next band program.

Figure 8:
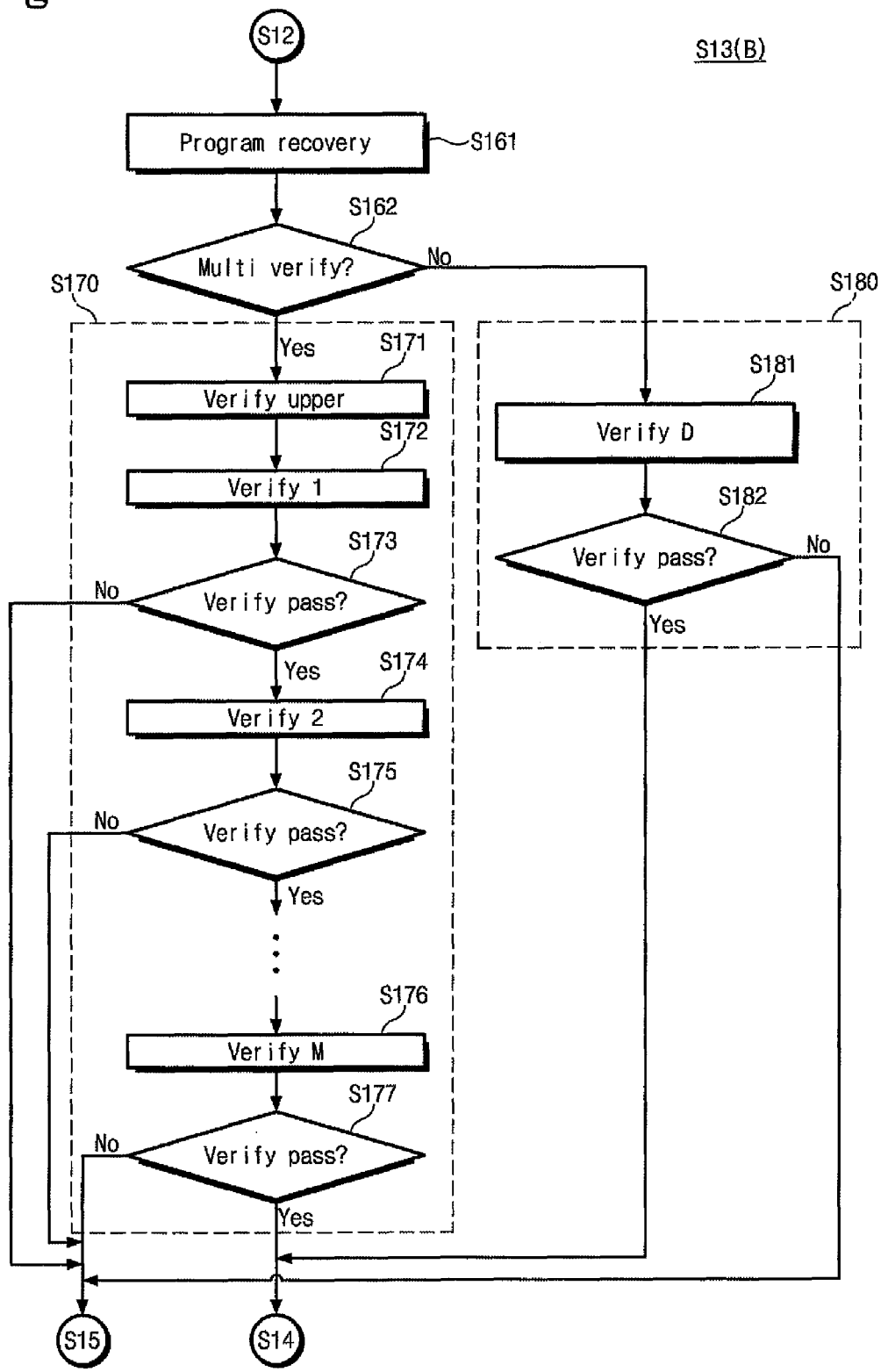
FIG. 8 is a flowchart showing the second verifying method of the step of S13 illustrated in FIG. 4, according to an exemplary embodiment.
Figure 9:
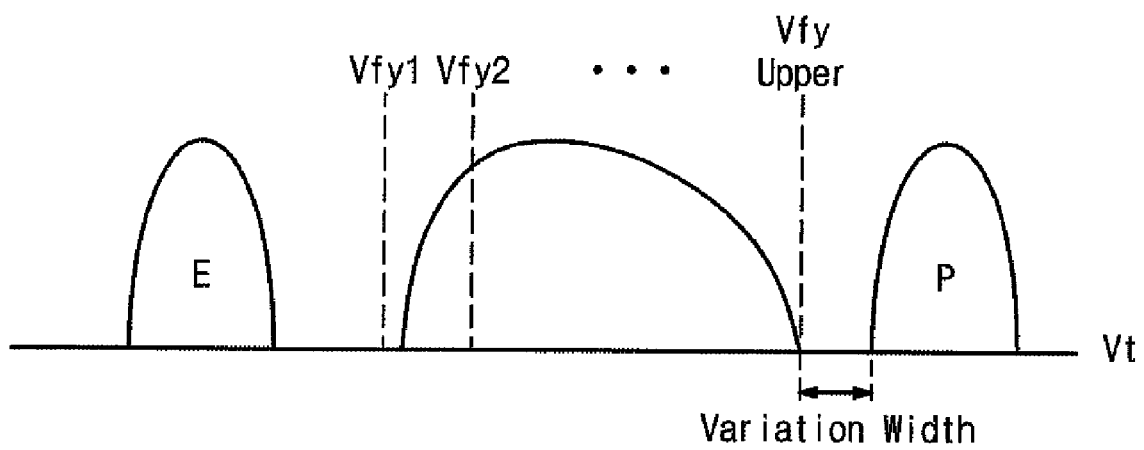
FIG. 9 shows a distribution of threshold voltage in the verification step illustrated in FIG. 7, according to an exemplary embodiment.

FIG. 8 is a program flowchart showing a second determining method for step S13 illustrated in FIG. 4, according to an illustrative embodiment. FIG. 9 shows a distribution of threshold voltages in the verification step illustrated in FIG. 7. Referring to FIG. 8 and FIG. 9, a second determining method S13(B) includes an upper verifying operation Verify Upper added to the first verifying operation S13(A) of FIG. 6. The upper verifying operation Verify Upper (step S171) is performed before the verifying operation Verify 1 (step S172). The upper verifying operation Verify Upper is used to determine a distribution width of the upper limitation verifying to acquire the upper limitation of the program. The distribution width of the upper limitation verifying may be used to select to the band register for the next band program. Steps S172-S177 and S181-S182 are substantially the same as steps S141-S146 and S151-S152 of FIG. 6, and therefore the corresponding descriptions of these steps will not be repeated.

The methods for the write operation discussed above may finish the program operation even though the program fails once the last band program BANDN is performed. In this example, a programmed cell may not be programmed properly after the last band program is performed to the programmed cell. In this case, the write operation may restart the multiple band programs from the first band program BAND0 when the programmed cell is not properly programmed after the last band program has been performed. However, methods according to various embodiments are not limited to this example.

Figure 10:
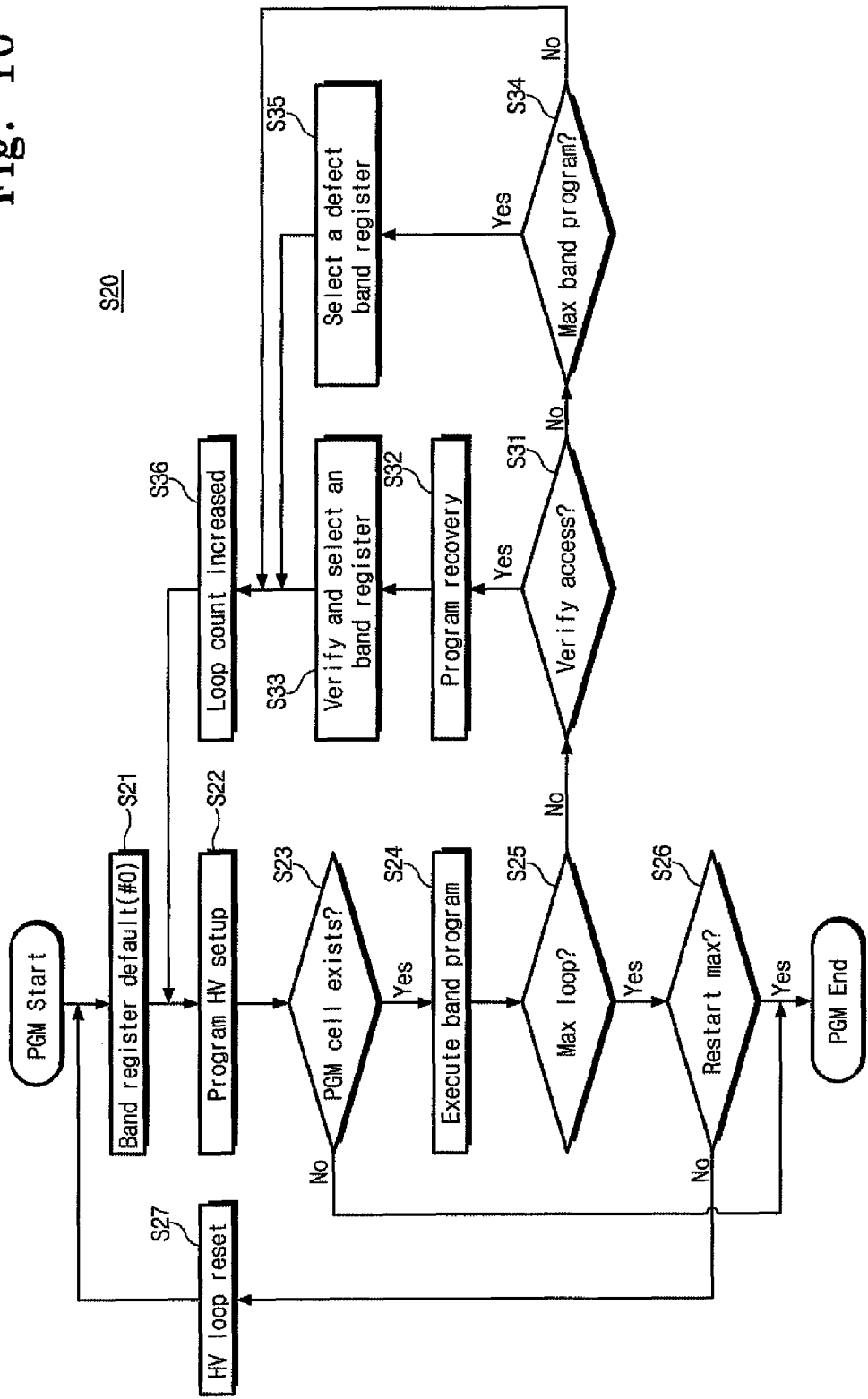
FIG. 10 is a flowchart showing a second writing method of the nonvolatile memory device, according to exemplary embodiments.

FIG. 10 is a flowchart showing a second writing method of the nonvolatile memory device, according to an illustrative embodiment. Hereinafter, the second writing method of the nonvolatile memory device will be described with reference to FIG. 1 through FIG. 3 and FIG. 10.

During the first band program BAND0, the default band register BR0 is selected in step S21. Then high voltages HV are set up according to the trim information of the selected band register in step S22. It is determined whether there is a memory cell to be programmed in step S23. When there is no memory cell to be programmed, the program operation ends. When there is a memory cell to be programmed, the high voltages HV, as shown in FIG. 3, are provided to the word line WL, the bit line BL and the bulk, so that execution of the band program begins in step S24.

Then, it is determined whether the maximum number of loops in the band program has been performed in step S25. When the maximum number of loops has not been performed, it is determined whether the number of restart times has reached the maximum in step S26. When the number of restart times is not at the maximum, the high voltages HV loop is reset in step S27 and the high voltages HV will be setup again, and the band program returns to the step S21. When the number of restart times is at the maximum, the program ends in failure. On the other hand, when it is determined in step S25 that the current band program is not at the maximum number of loops, the program continues to step S31. First, it is determined at step S31 whether verifying access occurs. The trim information of the selected band register may include information regarding verifying access. Also, verifying access may be used to select an optimized writing condition for the next band program.

When verifying access is performed, program recovery is performed in step S32, which includes discharging the word line high voltage to ground voltage. Then, in step S33, a verifying operation is performed and a band register for the next band program is selected according to the result of the verifying operation. The loop count number is then incremented in step S36. Meanwhile, when it is determined that verifying access is not performed in the step S31, it is determined whether the current band program is the maximum band program in step S34. The maximum band program number may be included in the trim information, for example. When the current band program is the maximum band program, the default band register of the next band program is selected in step S35. On the other hand, when the current band program is not the maximum band program, the loop count number is incremented in the step S36.

Figure 11:
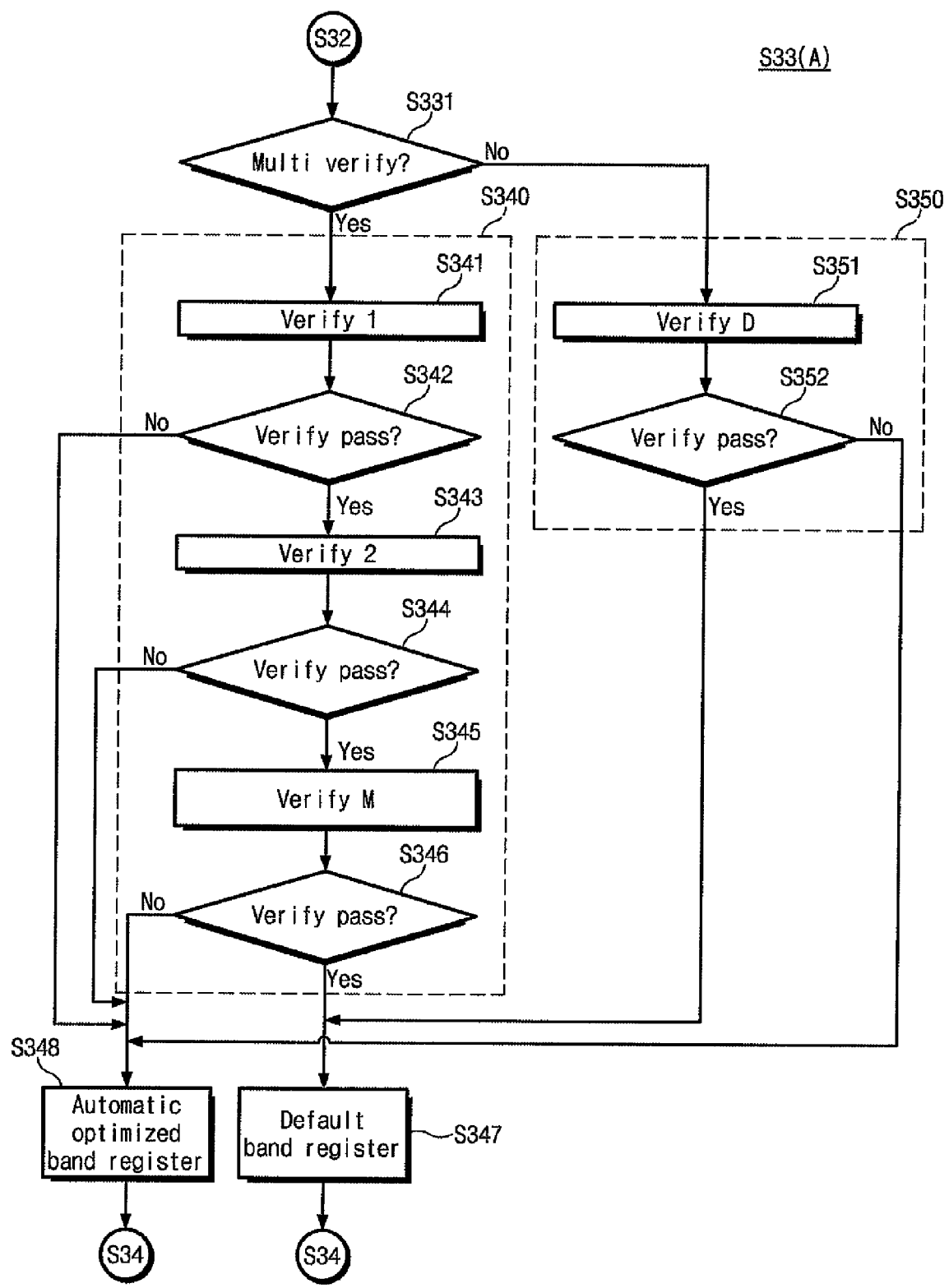
FIG. 11 is a flowchart showing a first selecting method of a band register that is used in a next band when the verifying operation occurs illustrated in FIG. 10, according to an exemplary embodiment.

FIG. 11 is a flowchart showing a first method of selecting a band register used for the next band program when the verifying operation occurs in the step S33 of FIG. 10, according to an illustrative embodiment. Referring to FIG. 11, the first method of selecting a band register is as follows.

After program recovery is performed in step S32, it is determined whether to perform multiple verifying operations in step S331 of FIG. 11. When multiple verifying operations are to be performed, step S340 will be performed as a next operation. When multiple verifying operations are not to be performed, step S350 will be performed.

Step S340 includes steps S341 through S348. When multiple verifying operations are to be performed, verifying operation Verify 1 is performed using first verifying voltage Vfy1 in step S341. It is determined whether verifying operation Verify 1 passes in step S342. When verifying operation Verify 1 has passed, verifying operation Verify 2 is performed using second verifying voltage Vfy2 in step S343. It is determined whether verifying operation Verify 2 passes in step S344. When verifying operation Verify 2 has passed, verifying operation Verify 3 is performed using verifying voltage Vfy3. It is determined whether verifying operation Verify 3 passes. In the same manner, verifying operation Verify M is performed with the Mth verifying voltage in step S345, and it is determined whether verifying operation Verify M passes in step S346. When the verifying operation Verify M has passed, the default band register will be selected for the next band program in step S347. When any of the verifying operations Verify 1 through Verify M has not passed, an optimized band register is selected in step S348 for the next band program.

When it is determined in step S331 that multiple verifying operations are not performed, step S350 is performed. First, verifying operation Verify D is performed using verifying voltage in step S351, and it is determined whether the verifying operation Verify D passes in step S352. When the verifying operation Verify D has passed, a default register will be selected for the next band program in step S347. When the verifying operation Verify D has not passed, an optimized band register will be selected in step S348 according to the distribution of threshold voltage of the programmed cell for the next band program.

Figure 12:
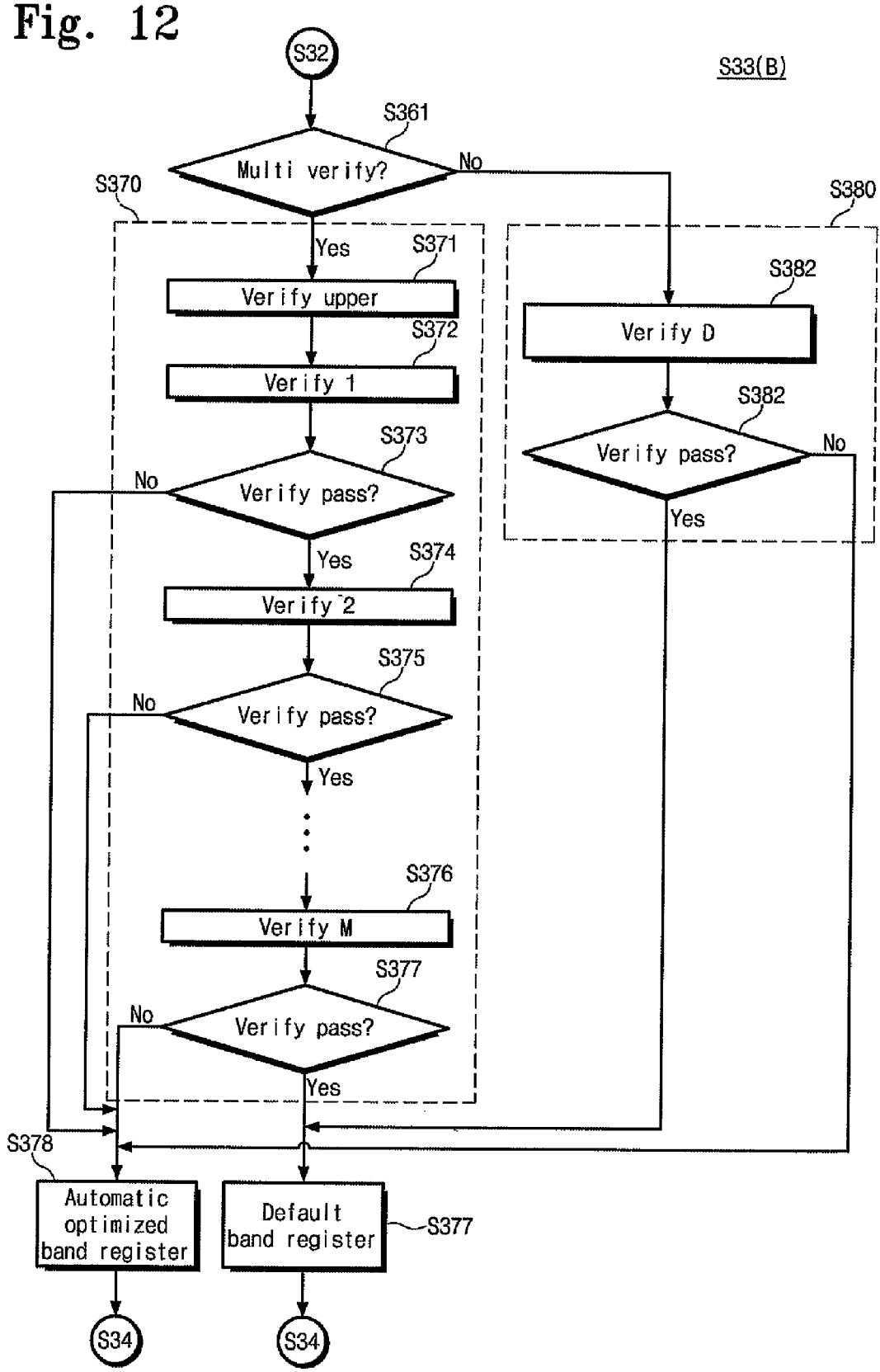
FIG. 12 is a flowchart showing a second selecting method of a band register that is used in a next band when the verifying operation occurs illustrated in FIG. 10, according to an exemplary embodiment.

FIG. 12 is a flowchart showing a second method of selecting a band register used in the next band program when the verifying operation occurs in the step S33 illustrated of FIG. 10, according to an illustrative embodiment. Referring to FIG. 12, the second method of selecting a band register includes an upper verifying operation Verify Upper in step S371 that is added to the first verifying operation S33(A) of FIG. 11. Steps S372-S377 and S381-S382 are substantially the same as steps S341-S348 and S351-S352 of FIG. 11, respectively, and therefore the corresponding descriptions of these steps will not be repeated.

FIG. 13 shows an example of trim information stored in band registers, according to various embodiments. Referring to FIG. 13, the trim information may include starting voltage (Vstart), step voltage (Vstep), program time (tPGM), the number of program cells (PGM Cell), whether to perform verifying (Vfy) or multiple verifying (Multi Vfy) operations, verifying level (Vfy Level), first verifying level (Vfy1 Level), . . . Nth verifying level (VfyN Level), the maximum number of bands (Band Max), and the maximum number of loops (Loop Max). For instance, the first band register BR0 stores information in which 2V of starting voltage, 2V of step voltage, 500 ns of program time, 16 program cells, no verifying and multiple verifying operations, no verifying levels, a maximum number of bands equal to 2 and a maximum number of loops equal to 64.

Program operations for a writing method have been discussed referring to FIG. 1 through FIG. 13. However, the program operations may be used in substantially the same manner for an erasing method, as well as the writing method. That is, the erasing method according to various embodiments may include selecting a band register storing an optimized erase condition and performing the erase method according to trim information of the selected band register.

The writing method according to various embodiments selects a band register storing an optimized writing condition during each band program and performs the write operation. As a result, the writing method according to various embodiments may acquire large margins of threshold voltages for the programmed memory cells.

Figure 14:
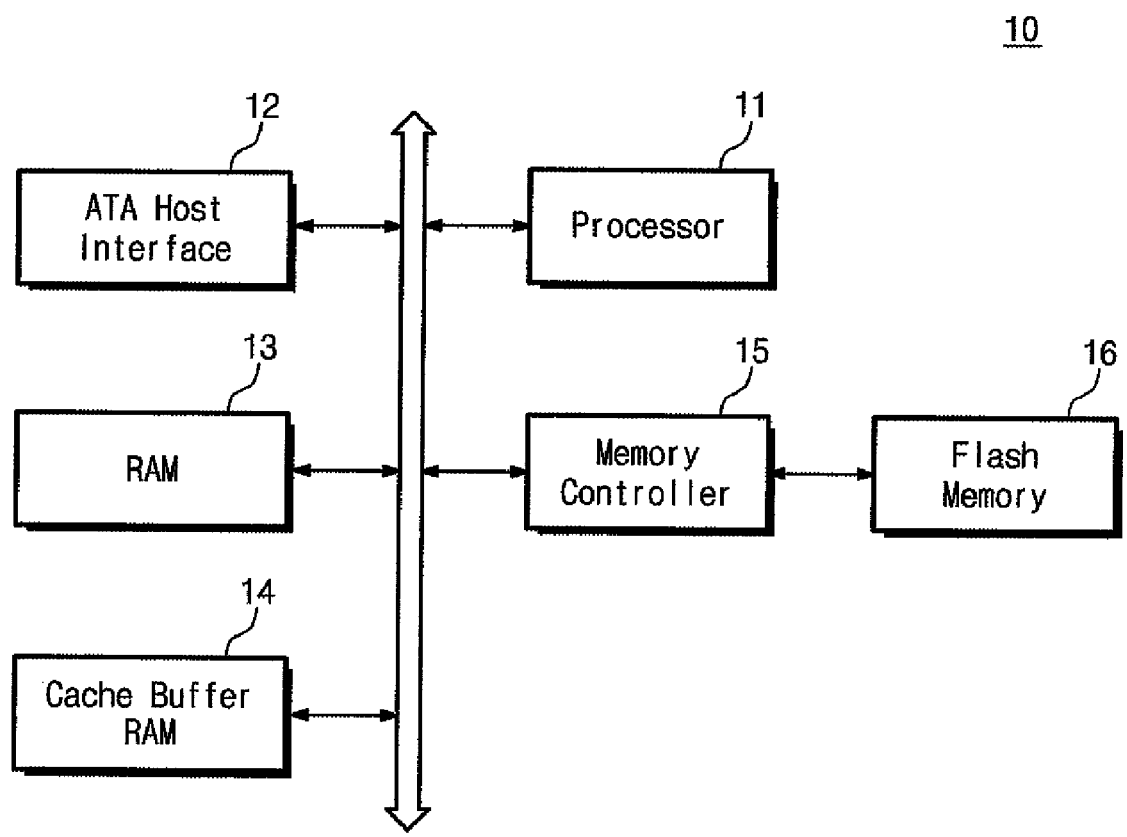
FIG. 14 is a memory system including the nonvolatile memory device applying the writing method, according to exemplary embodiments.

FIG. 14 is a memory system according to various embodiments. Referring to FIG. 14, the memory system 10 includes a memory controller 15 and a flash memory 16. The flash memory is substantially similar to the nonvolatile memory device in FIG. 1 and is configured to perform the writing method, as discussed in FIG. 1 through FIG. 13. Again referring to FIG. 14, a processor 11 receives a command from a host (not shown), and decides to store data from the host to the flash memory 16 or to read data from the flash memory 16 and transfer the read data to the host. An ATA host interface 12 exchanges data with the host under control of the processor 11.

The ATA host interface 12 receives commands and address information from the host and sends them to the processor 11 through a CPU bus. The ATA host interface 12 may be one of a serial ATA (SATA) interface, a parallel ATA (PATA) interface, and an external serial ATA (ESATA), for example. Data that is input through the ATA host interface 12 or that is to be sent to the host is transferred to a cache buffer RAM 14. A RAM 13 is used to temporarily store data required for operation of the memory system 10. Each of the RAM 13 and the RAM 14 may be a volatile memory device like DRAM or SRAM, for example.

The cache buffer RAM 14 temporarily stores data that is transferred between the host and the flash memory 16. Also, the cache buffer RAM 14 may be used to store a program to be processed by the processor 11. The cache buffer RAM 14 may be considered as a buffer memory, which may be configured by SRAM.

The memory controller 15 exchanges data with the flash memory 16, which is used as a storage device. The memory controller 15 includes an interface that is compatible with the type of flash memory 16, which may be one of NOR flash memory, NAND flash memory, One-NAND flash, and multi-level flash memory, for example.

The memory system 10 according to various embodiments may be used as a portable storage device, such as MP3, digital camera, PDA, e-Book and the like. Also, the memory system 10 according to various embodiments may be used as a storage device for digital TV or computer.

The memory system or storage device according to various embodiments may be mounted in various ways as packages, such as Package on Package (PoP), Ball Grid Array (BGA), Chip Scale Package (CSPs), Plastic Leaded Chip Carrier (PLCC), Plastic Dual In-Line Package (PDIP), Die in Waffle Pack, Die in Wafer Form, Chip on Board (COB), Ceramic Dual In-Line Package (CERDIP), Plastic Metric Quad Flat Pack (MQFP), Thin Quad Flat Package (TQFP), Small Outline IC (SOIC), Shrink Small Outline Package (SSOP), Thin Small Outline Package (TSOP), Thin Quad Flat Package (TQFP), System In Package (SIP), Multi Chip Package (MCP), Wafer-level Fabricated Package (WFP), Wafer-level Processed Stack Package (WSP).

While the present inventive concept has been described with reference to exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A method of performing a write operation of a nonvolatile memory device, the method comprising:
    defining multiple bands programs including a first band program and a second band program for the write operation;
    storing respective trim information in a plurality of band registers including a first band register and a second band register;
    performing the first band program using trim information from the first band register; and
    performing the second band program using trim information from a second band register after performing the first band program;
    wherein while the first band program is being performed, adaptively selecting a band register from among the plurality of band registers as the second band register that stores optimized trim information for the second band program, or else selecting a band register from among the plurality of band registers assigned as a default band register to the second band program as the second band register.

2. The method of claim 1, wherein the multiple bands includes a third band program performed after the second band program, the plurality of band registers includes a third band register, and the second band program comprises a verifying operation, such that the method further comprises:
    performing the third band program using trim information from the third band register; and
    using the verifying operation of the second band program to adaptively select a band register from among the plurality of band registers as the third band register that stores optimized trim information for the third band program, or else selecting a band register from among the plurality of band registers assigned as a default band register to the third band program as the third band register.

3. The method of claim 2, wherein the verifying operation for the second band program comprises multiple verifying operations.

4. The method of claim 3, wherein the multiple verifying operations include verifying an upper limitation to detect a program upper limitation for a memory cell being programmed by the second band program.

5. The method of claim 1, wherein performing each of the first and second band programs comprises:
    setting up high voltages using the trim information respectively provided by the first and second band registers;
    determining whether there is a memory cell to be programmed;
    respectively providing a high voltage selected from among the high voltages to a word line, a bit line and a bulk when there is a memory cell to be programmed;
    according to loop count, executing a current band program from among the multiple band programs, and then determining whether the a band loop count is at a maximum, else increasing the loop count.

6. A method of performing a write operation of a nonvolatile memory device, the method comprising:

performing a plurality of band programs sequentially, each band program being performed using a selected band register from among the plurality of band registers, each band register storing trim information defining a corresponding set of writing conditions for the write operation, wherein performing each band program comprises:

determining whether or not there is a memory cell to be programmed;

programming the memory cell using trim information stored by the selected band register;

selecting one of the plurality of band registers for a next band program to be sequentially performed in the plurality of band programs; and determining whether a band loop count is at a maximum and if not, increasing the band loop count, else determining whether a number of restart times is at a maximum, and if not again performing the plurality of band programs.

7. The method of claim 6, wherein upon determining that there is not a memory cell to be programmed, ending the write operation.

8. A method of performing a write operation of a nonvolatile memory device, the method comprising:

defining a set of sequentially executed bands programs within the write operation;

defining trim information respectively stored in a plurality of band registers, wherein the trim information controls execution of a band program;

assigning one band register selected from the plurality of band registers to each one of the band programs as a corresponding default band register; and while executing a current band program, making a determination as to which one of the plurality of band registers will control execution of a next band program in the set of sequentially executed band programs, wherein the determination comprises adaptively selecting a band register from among the plurality of band registers that stores optimized trim information for the next band program, or else selecting the corresponding default band register for the next band program.

9. The method of claim 8, wherein adaptively selecting the band register from among the plurality of band registers that stores optimized trim information for the next band program comprises:

performing a verifying operation during the current band program.

10. The method of claim 9, wherein the verifying operation selects the band register from among the plurality of band registers according to an optimized starting voltage.

11. The method of claim 9, wherein the verifying operation includes multiple verifying operations that select the band register from among the plurality of band registers according to an optimized starting voltage.

* * * * *